(12) United States Patent
Yamaji et al.

(10) Patent No.: US 8,334,737 B2
(45) Date of Patent: Dec. 18, 2012

(54) ACOUSTIC WAVE DEVICE AND ELECTRONIC APPARATUS USING THE SAME

(75) Inventors: Toru Yamaji, Osaka (JP); Koji Kawakita, Nara (JP); Eiji Kawamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 386 days.

(21) Appl. No.: 12/836,867

(22) Filed: Jul. 15, 2010

(65) Prior Publication Data

US 2011/0012695 A1    Jan. 20, 2011

(30) Foreign Application Priority Data

Jul. 15, 2009   (JP) ................................. 2009-166540
Jul. 15, 2009   (JP) ................................. 2009-166541

(51) Int. Cl.
*H03H 9/00*    (2006.01)
*H01L 41/00*    (2006.01)

(52) U.S. Cl. ........................................ 333/193; 310/344

(58) Field of Classification Search .................. 333/133, 333/193, 194, 195, 196; 310/313 R, 344, 310/348

See application file for complete search history.

(56) References Cited

U.S. PATENT DOCUMENTS

| | | | |
|---|---|---|---|
| 7,259,500 B2 * | 8/2007 | Iwamoto et al. | 310/340 |
| 7,385,463 B2 * | 6/2008 | Koga et al. | 333/133 |
| 7,427,824 B2 * | 9/2008 | Iwamoto et al. | 310/344 |
| 8,004,160 B2 * | 8/2011 | Tsuda et al. | 310/348 |

FOREIGN PATENT DOCUMENTS

WO   WO 2006/106831 A1   10/2006

* cited by examiner

*Primary Examiner* — Dean O Takaoka
(74) *Attorney, Agent, or Firm* — RatnerPrestia

(57) ABSTRACT

An acoustic wave device includes a piezoelectric substrate, an IDT electrode on the substrate, an internal electrode above the substrate, a side wall above the internal electrode, a lid on the side wall, an electrode base layer on the internal electrode, a connection electrode on the electrode base layer, and an anti-corrosion layer between the internal electrode and the side wall. The internal electrode is electrically connected to the IDT electrode. The side wall surrounds the IDT electrode. The lid covers the IDT electrode to provide a space above the IDT electrode. The electrode base layer is provided outside the space and the side wall. The anti-corrosion layer protrudes outside the side wall, and is made of material less soluble in plating solution than the internal electrode. This acoustic wave device prevents the internal electrode from breaking due to plating solution, hence being manufactured at a high yield rate.

12 Claims, 15 Drawing Sheets

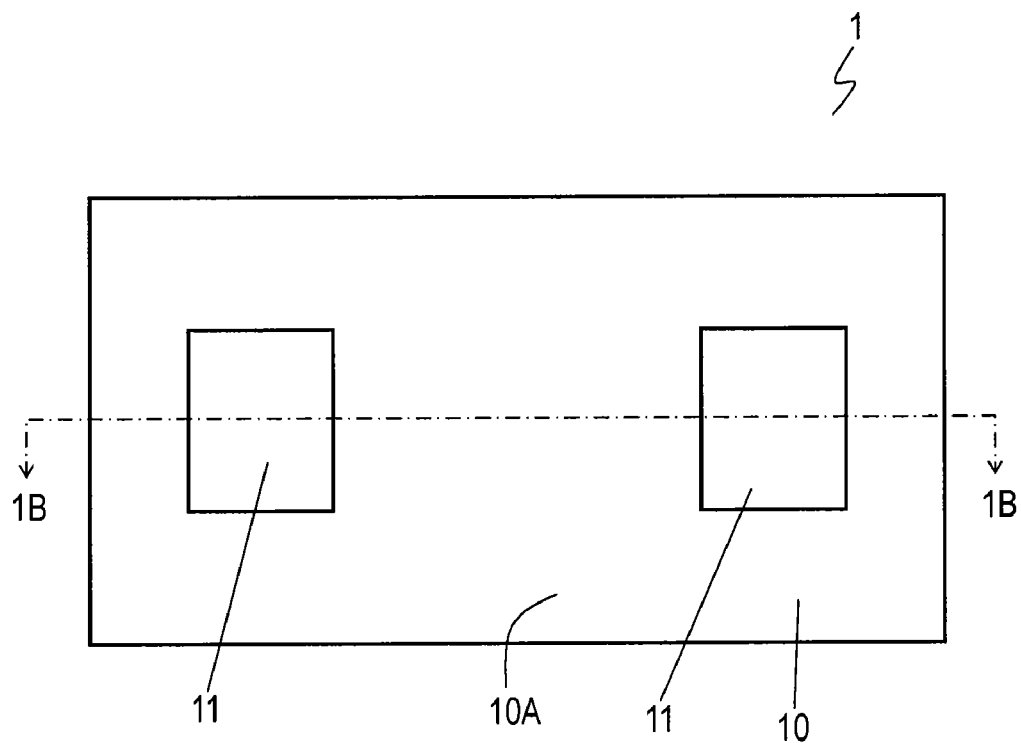

ACOUSTIC WAVE DEVICE AND ELECTRONIC APPARATUS USING THE SAME

FIELD OF THE INVENTION

The present invention relates to an acoustic wave device and an electronic apparatus, such as a portable phone, including the device.

BACKGROUND OF THE INVENTION

FIG. 9 is a sectional view of conventional acoustic wave device 101, a chip-size packaged device. Acoustic wave device 101 includes piezoelectric substrate 102, interdigital transducer (IDT) electrode 103 provided on piezoelectric substrate 102, insulator 110 provided on piezoelectric substrate 102 for covering and protecting IDT electrode 103 from the outside.

Acoustic wave device 101 further includes internal electrode 104 provided on piezoelectric substrate 102, side wall 105 provided on internal electrode 104, lid 107 provided on side wall 105, electrode base layer 109 provided on internal electrode 104, and connection electrode 112 provided on electrode base layer 109.

Internal electrode 104 is made of, e.g. aluminum, and electrically connected to IDT electrode 103. Side wall 105 surrounds IDT electrode 103. Lid 107 is bonded to side wall 105 with adhesive layer 106 for covering space 108 provided above IDT electrode 103. Electrode base layer 109 is provided outside space 108 and side wall 105, and is made of, e.g. copper. Connection electrode 112 extends through insulator 110 for electrically connecting external electrode 111 to IDT electrode 103.

Connection electrode 112 has a columnar shape. Electrode base layer 109 is formed of metal thin film by a sputtering method. Then, connection electrode 12 is formed by an electrolytic plating method with electrode base layer 109 being energized.

In acoustic wave device 101, side wall 105 and internal electrode 104 may peeled off to produce a void between them. In this case, electrode base layer 109 is not attached strongly to the boundary between side wall 105 and internal electrode 104 when base layer 109 is formed by the sputtering. In such a case, internal electrode 104 is exposed from electrode base layer 109 at the boundary, so that plating solution used in foregoing electrolytic plating process corrodes internal electrode 104. As a result, internal electrode 104 may be broken, accordingly reducing a yield rate of acoustic wave device 101.

SUMMARY OF THE INVENTION

An acoustic wave device includes a piezoelectric substrate, an interdigital transducer (IDT) electrode on the substrate, an internal electrode above the substrate, a side wall above the internal electrode, a lid on the side wall, an electrode base layer on the internal electrode, a connection electrode on the electrode base layer, and an anti-corrosion layer between the internal electrode and the side wall. The internal electrode is electrically connected to the IDT electrode. The side wall surrounds the IDT electrode. The lid covers the IDT electrode to provide a space above the IDT electrode. The electrode base layer is provided outside the space and the side wall. The anti-corrosion layer protrudes outside the side wall, and is made of material less soluble in plating solution than the internal electrode.

This acoustic wave device prevents the internal electrode from breaking due to plating solution, hence being manufactured at a high yield rate.

BRIEF DESCRIPTION OF THE DRAWINGS

FIG. 1A is a top view of an acoustic wave device in accordance with Exemplary Embodiment 1 of the present invention.

DETAIL DESCRIPTION OF PREFERRED EMBODIMENTS

Exemplary Embodiment 1

Figure 1B:
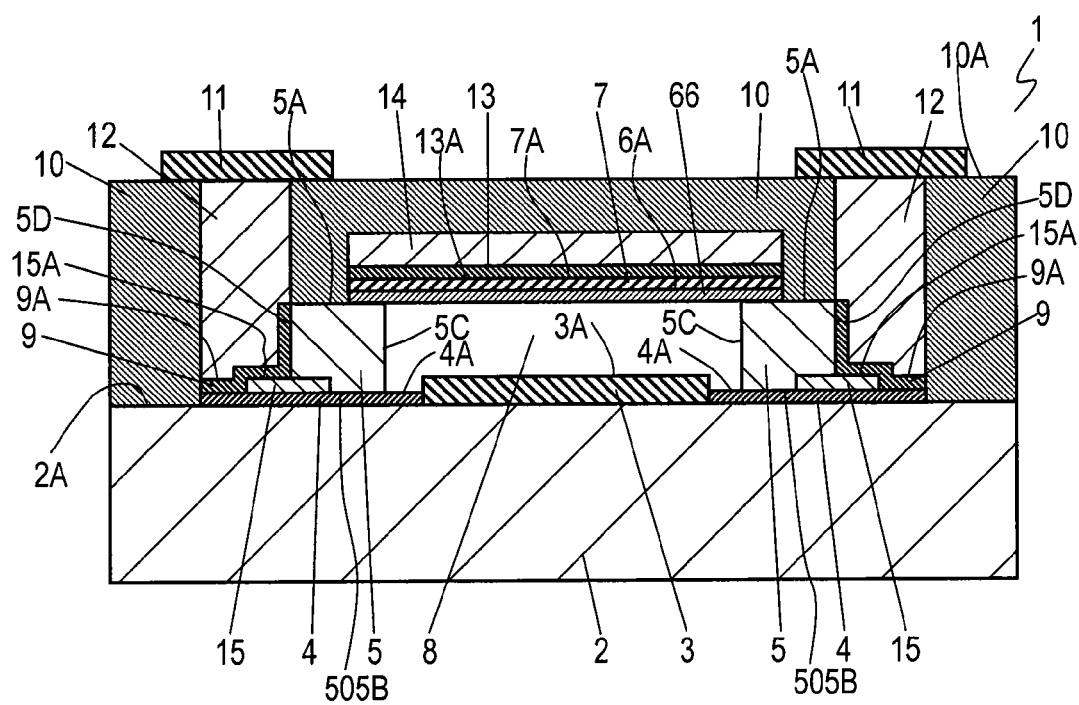
FIG. 1B is a sectional view of the acoustic wave device on line 1B-1B shown in FIG. 1A.

FIG. 1A is a top view of an acoustic wave device in accordance with Exemplary Embodiment 1 of the present invention. FIG. 1B is a sectional view of the acoustic wave device on line 1B-1B shown in FIG. 1A.

Acoustic wave device 1 is a chip-size packaged device and includes piezoelectric substrate 2, interdigital transducer (IDT) electrode 3 provided on upper surface 2A of substrate 2, and insulator 10 provided on upper surface 2A of piezoelectric substrate 2 for covering and protecting IDT electrode 3 from the outside.

Acoustic wave device 1 further includes internal electrode 4 provided on upper surface 2A of piezoelectric substrate 2, i.e., above upper surface 2A of piezoelectric substrate 2, side wall 5 provided on upper surface 4A of internal electrode 4, i.e., above upper surface 4A of internal electrode 4, and lid 7 provided on upper surface 5A of side wall 5. Internal electrode 4 is electrically connects with IDT electrode 3. Side wall 5 surrounds IDT electrode 3. Lid 7 is rigidly mounted onto upper surface 5A of side wall 5 with adhesive layer 66 such that lid 7 covers space 8 provided above upper surface 3A of IDT electrode 3. Side wall 5 has inner side surface 5C facing space 8 and outer side surface 5D opposite to inner side surface 5C.

Acoustic wave device 1 further includes electrode base layer 9 provided on upper surface 4A of internal electrode 4, connection electrode 12 provided on upper surface 9A of electrode base layer 9, and external electrode 11 provided on upper surface 10A of insulator 10. Electrode base layer 9 is provided along outer side surface 5D of side wall 5. Connection electrode 12 extends from upper surface 9A of electrode base layer 9 to upper surface 10A of insulator 10, hence extending through insulator 10 for electrically connecting external electrode 11 to IDT electrode 3.

Acoustic wave device 1 further includes lid base layer 13 provided on upper surface 7A of lid 7, and lid-reinforcing layer 14 provided on upper surface 13A of lid base layer 13 for increasing mechanical strength of lid 7.

Acoustic wave device 1 further includes anti-corrosion layer 15 provided between internal electrode 4 and side wall 5. Anti-corrosion layer 15 protrudes from outer side surface 5D of side wall 5 and is made of material which is less soluble in plating solution than the material for internal electrode 4 is.

Piezoelectric substrate 2 is made of single-crystal piezoelectric material, such as crystal, lithium tantalite, lithium niobate, or potassium niobate. Substrate 2 has a thickness ranging from about 100 μm to 350 μm.

IDT electrode layer 3 includes comb-shaped electrodes having a thickness ranging from about 0.1 μm to 0.5 μm, and is made of single metal selected from aluminum, copper, silver, gold, titanium, tungsten, platinum, chrome, or molybdenum. Layer 3 can be also made of alloy mainly containing at least one of the metals, or laminated metal containing the metals.

Internal electrode 4 is a conductor for electrically connecting external electrode 11 to IDT electrode 3, and is made of single metal of aluminum, copper, or silver. Electrode 4 can be made of alloy containing mainly at least one of the metals, or laminated metals.

Side wall 5 surrounds IDT electrode 3 at least partly, and has a height ranging from about 5 μm to 15 μm. Side wall 5 is made of insulating material, and preferably made of resin since the resin can be processed to have a predetermined shape easily. To be more specific, the resin can be photosensitive resin, such as photosensitive polyimide resin, photosensitive epoxy resin, or photosensitive acrylate resin, and allows side wall 5 to have a predetermined shape accurately, which is necessary to form plural acoustic wave devices 1 on piezoelectric substrate 2. Photosensitive polyimide resin is preferable among others for side wall 5 since this resin has a high glass transitional point and high reliability in a high temperature environment.

Adhesive layer 66 is made of adhesive agent and has a thickness ranging from about 1 μm to 10 μm. To be more specific, the adhesive agent can be made of, e.g. epoxy-based resin, polyphenylene-based resin, or butadiene-based resin. The adhesive agent can be made of mixture resin containing the above resins. Adhesive layer 66 is made of material having a bonding force per unit area to insulator 10 than the material for side wall 5.

Lid 7 is a plate having a thickness ranging from about 1 μm to 10 μm and is bonded to upper surface 5A of side wall 5 with adhesive layer 66. Lid 7 together with piezoelectric substrate 2 and side wall 5 accommodates IDT electrode 3. Lid 7 is preferably made of metal because of its excellent mechanical strength and electrical conductivity that allows controlling electrical potential of lid 7. Copper for the material of lid 7 is more preferable because copper has a liner expansion coefficient similar to that of single crystal piezoelectric substrate 2. Lid 7 can have a foil shape, and stuck on adhesive layer 66 previously formed on the upper surface of side wall 5. This structure allows acoustic wave device 1 to be handled easily during manufacturing processes.

Space 8 is an airtight area surrounded by piezoelectric substrate 2, side wall 5, and lid 7, and accommodates IDT electrode 3 therein. Space 8 can be filled with air at a normal atmospheric pressure; however, space 8 is preferably sealed and decompressed to a pressure lower than the atmospheric pressure so as to prevent the IDT electrode from corrosion.

Figure 1C:
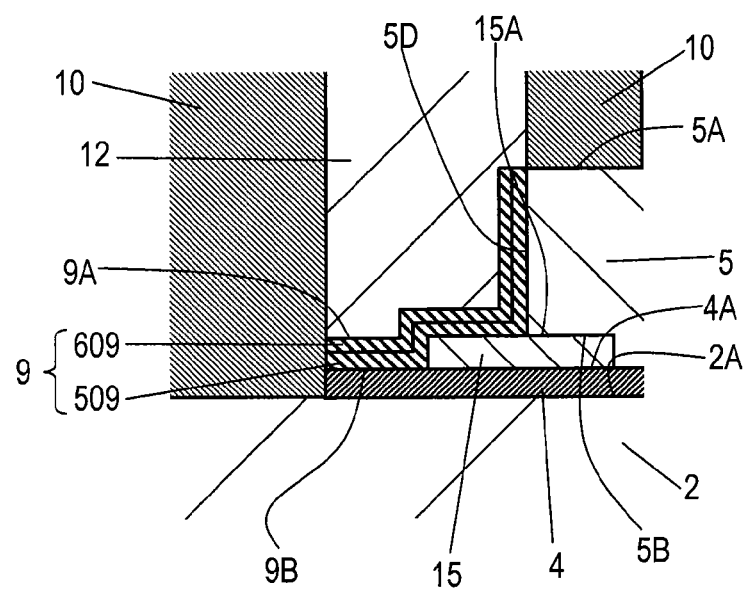
FIG. 1C is a further sectional view of an exemplary embodiment of the present invention.

Electrode base layer 9 is made of metallic thin film and formed on upper surface 4A of internal electrode 4 and outside of side wall 5, i.e. opposite to space 8 with respect to wall 5. Electrode base layer 9 is also formed on outer side surface 5D of side wall 5. Electrode base layer 9 is made of single metal of titanium, copper, nickel, chrome, or magnesium. Electrode base layer 9 can be made of alloy mainly containing at least one of the metals. These materials are less soluble in plating solution than the material for internal electrode 4 is. Titanium among others is preferable for Electrode base layer 9 because of its excellent adhesive properties. FIG. 1C shows another structure of electrode base layer 9. As shown in FIG. 1C, Electrode base layer 9 can have a double-layer structure, including titanium layer 509 and copper layer 609 provided on titanium layer 509. Titanium layer 509 is made of titanium and provided on upper surface 4A of internal electrode 4, upper surface 15A of anti-corrosion layer 15, and outer side surface 5D of side wall 5. Copper layer 609 is made of copper. This structure allows connection electrode 12 to be formed easily.

Insulator 10 is placed on upper surface 2A of piezoelectric substrate 2 and outer side surface 5D of side wall 5, and on upper surface 5A of wall 5 and upper surface 7A of lid 7. Insulators 10 together with side wall 5 surround connection electrodes 12. Insulator 10 covers entirely upper surface 2A, i.e. a main surface of piezoelectric substrate 2 so as to protect IDT electrode 3 and others from mechanical shocks and moisture. Insulator 10 also covers lid 7 and lid-reinforcing layer 14. Insulator 10 is preferably made of thermosetting resin because of its excellence in handling. Epoxy resin is more preferable to insulator 10 because of its heat resistance and air-tightness. Epoxy resin containing inorganic filler is more preferable to insulator since it lowers a linear expansion coefficient of insulator 10. The inorganic filler may employ aluminum oxide powder, $SiO_2$ powder, or MgO powder.

External electrode 11 is formed on upper surface 10A of insulator 10, i.e. outside of insulator 10, and is electrically connected with connection electrode 12. According to Embodiment 1, insulator 10 is formed between external electrode 11 and side wall 5 to prevent electrode 11 from directly contacting side wall 5.

Connection electrode 12 is formed by an electrolytic plating method on internal electrode 4 via electrode base layer 9. Electrode 12 is preferably made of copper since copper has large mechanical strength and has a linear expansion coefficient identical to that of piezoelectric substrate 2.

Lid base layer 13 is formed on lid 7 and made of metal thin film of at least single metal of titanium, copper, nickel, chrome, or magnesium. The metal thin film can be also formed of alloy mainly containing at least one of the metals. Titanium among others for layer 13 is preferable because of its excellent adhesiveness. Lid base layer 13 can be in a double-layer structure including the titanium layer and the copper layer similarly to electrode base layer 9 shown in FIG. 1C. This structure is preferable because it allows lid reinforcing layer 14 to be formed easily. Lid base layer 13 functions as a base coating for the electrolytic plating.

Lid reinforcing layer 14 is formed by the electrolytic plating process on upper surface 13A of lid base layer 13, and has a thickness ranging from about 20 μm to 40 μm. Lid reinforcing layer 14 is preferably made of copper because copper has a large mechanical strength and has a linear expansion coefficient identical to that of piezoelectric substrate 2.

Anti-corrosion layer 15 is provided between internal electrode 4 and side wall 5, and protrudes from outer side surface 5D of wall 5 to the outside from top view. Anti-corrosion layer 15 has a thickness ranging about 0.01 μm to 1 μm. Anti-corrosion layer 15 is made of material less soluble in plating solution than material of internal electrode 4. Anti-corrosion layer 15 is not necessarily made of metal; however, metal reduces an ohmic loss of layer 15. The metal can be at least one single metal of titanium, chrome, molybdenum, tungsten, gold, or platinum. Anti-corrosion layer 15 can be also made of alloy mainly containing the above metals. Titanium among others is preferable for layer 15 because it has high adhesiveness and yet low solubility in the plating solution. Anti-corrosion layer 15 can be made of insulating material mainly containing, e.g. silicon nitride, silicon oxynitride, or silicon oxide.

A void may be produced between side wall 5 and internal electrode 4, so that the void prevents electrode base layer 9 from adhering strongly enough to the boundary between side wall 5 and internal electrode 4. Even in this case, anti-corrosion layer 15 formed between electrode 4 and wall 5 prevents internal electrode 4 from being corroded by the plating solution used during the electrolytic plating process which forms connection electrode 12. This arrangement prevents internal electrode 4 from breaking, accordingly raising the yield rate of acoustic wave device 1.

Anti-corrosion layer 15 made of metal oxide, such as titanium oxide, roughens the surface of anti-corrosion layer 15, hence adhering to side wall 5 securely.

Anti-corrosion layer 15 can be provided only between internal electrode 4 and an edge where lower surface 505B is connected with outer side surface 5D of side wall 5. This arrangement reduces an ohmic loss caused by anti-corrosion layer 15. Anti-corrosion layer 15 made of metal between entire lower surface 505B of wall 5 and internal electrode 4 increases the adhesiveness between electrode 4 and side wall 5.

A method for manufacturing acoustic wave device 1 in accordance with Embodiment 1 will be described below. FIGS. 2A to 2J are sectional views of acoustic wave device 1 for illustrating processes for manufacturing acoustic wave device 1.

Figure 2A:
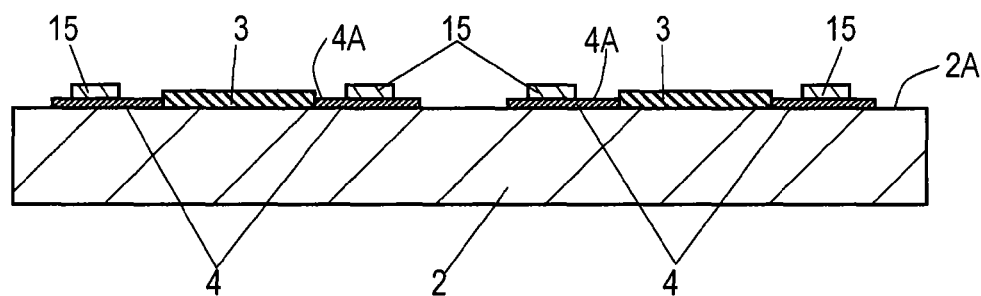
FIGS. 2A to 2J are sectional views of the acoustic wave device in accordance with Embodiment 1 for illustrating process for manufacturing the acoustic wave device.

First, as shown in FIG. 2A, plural IDT electrodes 3 are formed on upper surface 2A of piezoelectric substrate 2 by sputtering with a photolithographic technique using resist. Internal electrodes 4 are formed on upper surface 2A. Then, anti-corrosion layer 15 is formed on upper surface 4A of internal electrode 4 by a vapor deposition method.

Figure 2B:
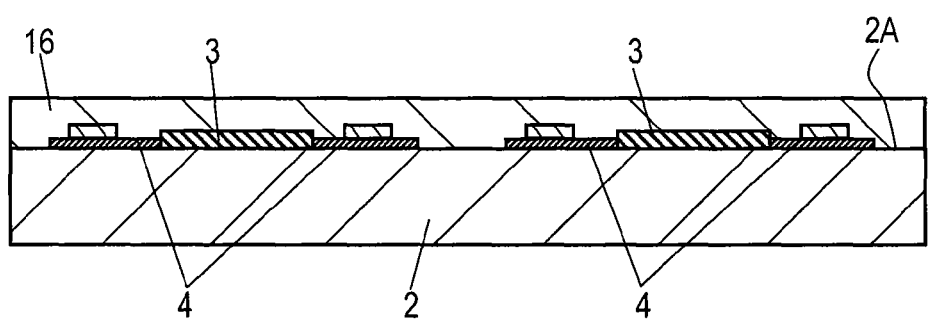

Next, as shown in FIG. 2B, photosensitive polyimide-based resin 16 is formed entirely on upper surface 2A of piezoelectric substrate 2 for covering IDT electrodes 3 and internal electrodes 4 by a spin-coating method, dispensing method, or screen printing method. The spin-coating method among others is preferable because this method provides the film with a uniform thickness.

Figure 2C:
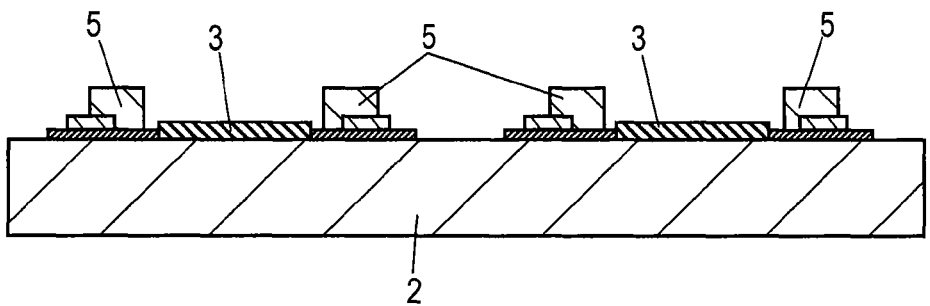

Next, the resin is exposed and developed from upper surface 2A, and is then, thermally hardened to form side walls 5 surrounding IDT electrodes 3, as shown in FIG. 2C. After forming walls 5 having a predetermined shape, side wall 5 is heated if necessary for accelerating the hardening of the material.

Figure 2D:
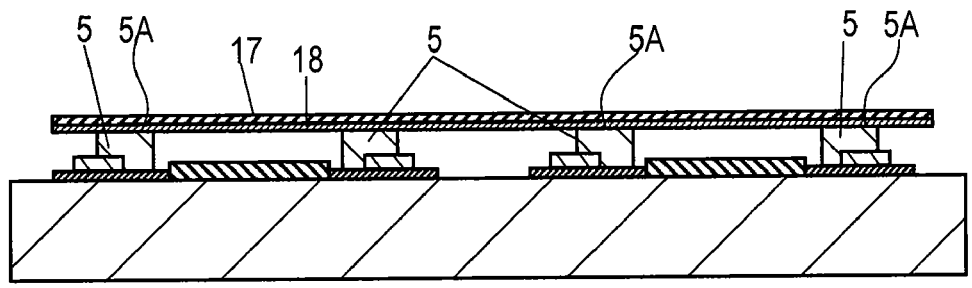
Figure 2E:
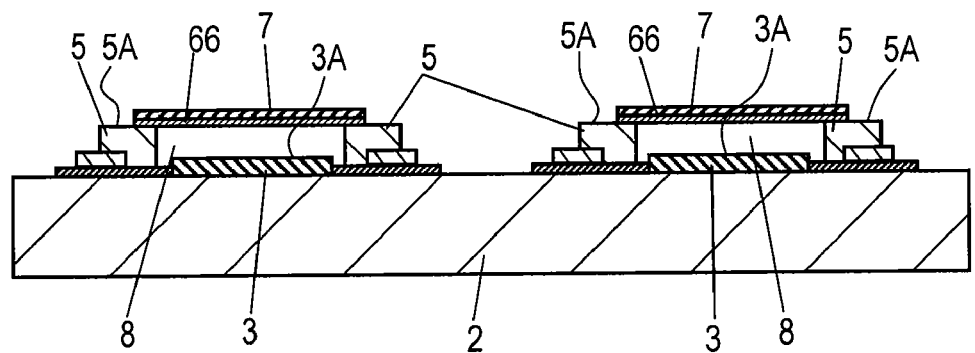

Then, as shown in FIG. 2D, metal foil 17 to be lid 7 is adhered onto upper surfaces 5A of side walls 5 with adhesive agent 18. Metal foil 17 is patterned to have a predetermined shape by etching with a photolithographic method using a resist, and then, the resist is removed. Then, an unnecessary portion of adhesive agent 18 is removed by a dry etching method, thus covering space 8 above IDT electrodes 3 with lid 7 and adhesive layer 66, as shown in FIG. 2E. No portion of lid 7 or adhesive layer 66 remains preferably entirely on upper surfaces 5A of walls 5. In other words, viewing from top, lid 7 and adhesive layer 66 are preferably located inside the outer edge of upper surfaces 5A connected with outer side surfaces 5D of wall 5. Lid 7 and adhesive layer 66 protruding outward from upper surfaces 5A in view from top prevent base layer 19 which is supposed to be formed by sputtering after this step from adhering to the boundary between anti-corrosion layer 15 and outer side surfaces 5D or side walls 5.

Figure 2F:
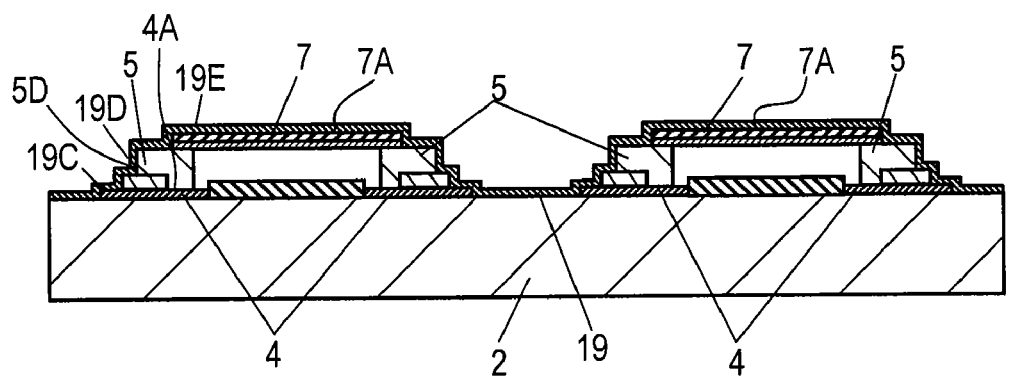

Next, as shown in FIG. 2F, base layer 19 is formed entirely on upper surface 2A of piezoelectric substrate 2 by sputtering. Portion 19D of layer 19 is provided on outer side surface 5D of wall 5. Portion 19C of layer 19 is provided on upper surface 4A of internal electrode 4. Portions 19D and 19C of base layer 19 constitute electrode base layer 9. Portion 19E of base layer 19 provided on upper surface 7A of lid 7 constitutes lid base layer 13.

Electrode base layer 9 is not formed in holes of side walls 5 by sputtering but is formed on the partially exposed peripheries of walls 5. This structure prevents electrode base layer 9 from breaking, thereby preventing connection electrode 12 supposed to be formed by the electrolytic plating process in the next step from breaking.

Then, a resist is formed on portions to grow due to the electrolytic plating by photolithographic technique. Specifically, the resist exposes, from the resist, portions 19C and 19D to be electrode base layer 9 and portion 19E to be lid base layer 13, and is formed to cover the other portion of base layer 9. Then, the first electrolytic plating with a plating solution is performed so that a portion of connection electrode 12 can be formed on electrode base layer 9. At this moment, lid reinforcing layer 14 is formed on lid base layer 13. Thus, lid reinforcing layer 14 reinforces lid 7, and can be formed simultaneously to connection electrode 12, hence efficiently producing lid reinforcing layer 14.

Next, a resist is formed entirely on a main surface of piezoelectric substrate 2 except a space above connection electrode 12. The resist is formed also on upper surface 14A of lid reinforcing layer 14. Then, the second electrolytic plating with a plating solution is performed so that the resist forming the connection electrode 12 can develop upward above the resist. Then, the resist is removed, as shown in FIG. 2G.

In the case that lid 7 is mechanically strong, lid reinforcing layer 14 is not necessarily formed. Then, only the first electrolytic plating is needed for forming connection electrode 12.

Figure 2G:
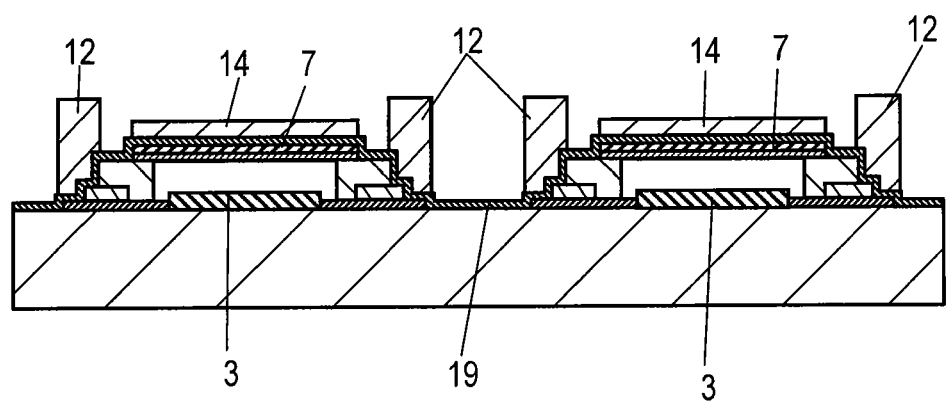

In FIG. 2G, connection electrodes 12 are separated from lid reinforcing layer 14. However, the resist between at least one of connection electrodes 12 and lid reinforcing layer 14 can be removed so that connection electrodes 12 can be connected to lid reinforcing layer 14 during the first electrolytic plating process. This structure prevents lid 7 and layer 14 from floating electrically to stabilize electric potentials of these elements. In particular, the connection between lid 7, lid reinforcing layer 14 and connection electrode 12, which functions as a grounding terminal, allows lid 7 and lid reinforcing layer 14 to be at the ground potential, so that lid 7 and lid reinforcing layer 14 can function as a shielding layer that protects IDT electrode 3 from noises.

Figure 2H:
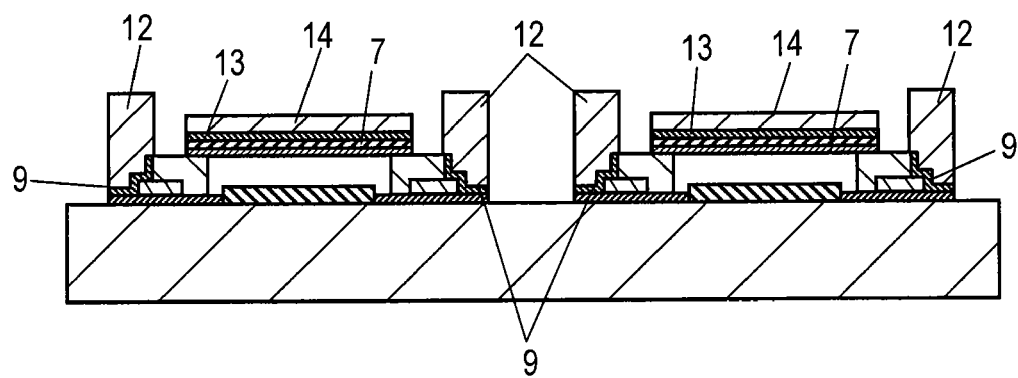

Lid reinforcing layer 14 conductive to connection electrode 12 via base layer 19, however, is disconnected from electrode 12 so that they can be isolated electrically from each other, as shown in FIG. 2H. In this case, base layer 19 is removed by etching. In the case that lid reinforcing layer 14 is intentionally connected to electrode 12 by plating, base layer 19 provided between lid reinforcing layer 14 and electrode 12 is not removed.

Figure 2I:
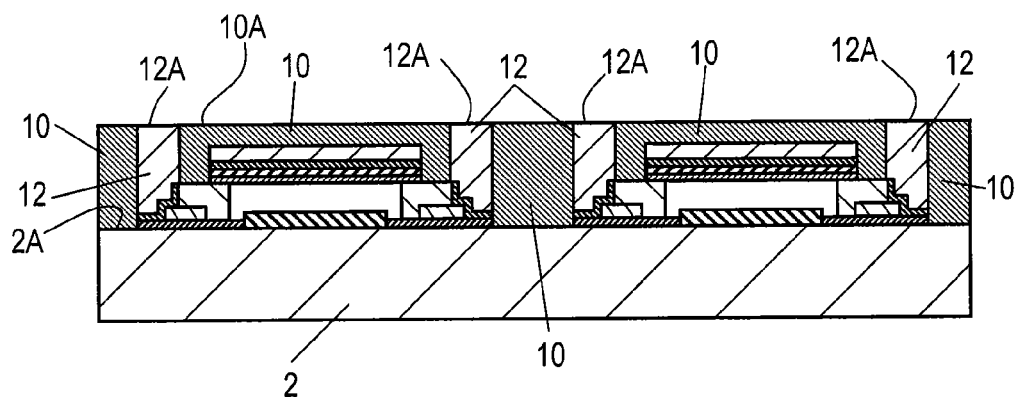

As shown in FIG. 2I, insulator 10 is formed by a printing method for covering the main surface of piezoelectric substrate 2 and elements placed on the main surface while upper surfaces 12A of connection electrodes 12 are exposed. In order to allow insulators 10 to have a height identical to that of connection electrodes 12, insulator 10 is formed temporarily to have a height larger than that of upper surfaces 12A of electrodes 12, then is ground off mechanically. In this case, insulator 10 is formed to cover everything on upper surfaces 2A including electrodes 12, and then, is ground off mechanically. However, the height of insulators 10 can be hardly identical to that of electrodes 12 without grinding off electrodes 12. This mechanical grinding of insulators 10 thus involves grinding off of electrodes 12 partly. Considering this fact, connection electrodes 12 is preferably formed by the electrolytic plating process to have a height slightly larger than the height actually required. The grinding off of insulators 10 and electrodes 12 allows the heights of these elements to be identical to each other, and achieves a great flatness, so that acoustic wave device 1 can have a desirable shape to be mounted on a board.

The resist formed after the first electrolytic plating process can be used as insulator 10 on lid reinforcing layer 14.

Figure 2J:
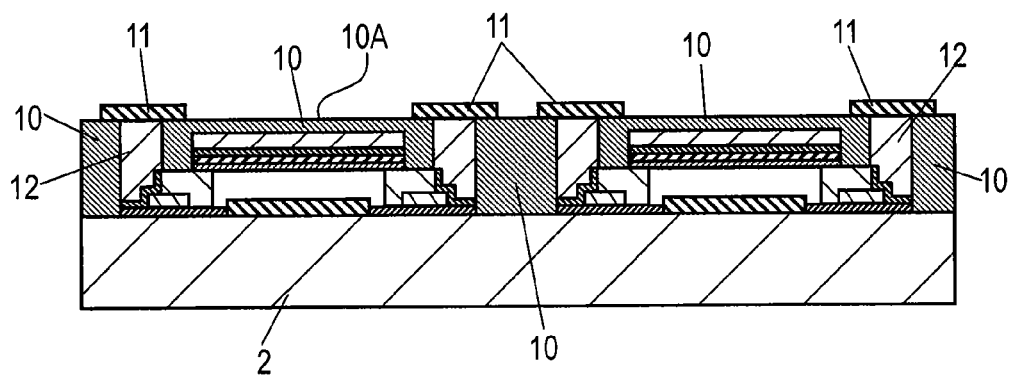

Finally, as shown in FIG. 2J, external electrodes 11 are formed on upper surfaces 10A of insulators 10. External electrodes 11 are connected electrically to upper surfaces 12A of connection electrodes 12. Then, piezoelectric substrate 2 and insulator 10 are divided simultaneously by dicing, thereby providing individual chips of acoustic wave device 1 from an assembled board.

Next, acoustic wave device 1 in accordance with Embodiment 1 used in an acoustic wave filter having a pattern in which internal electrode 4 and side wall 5 are placed will be described below with reference to FIGS. 3 and 4.

Figure 3:
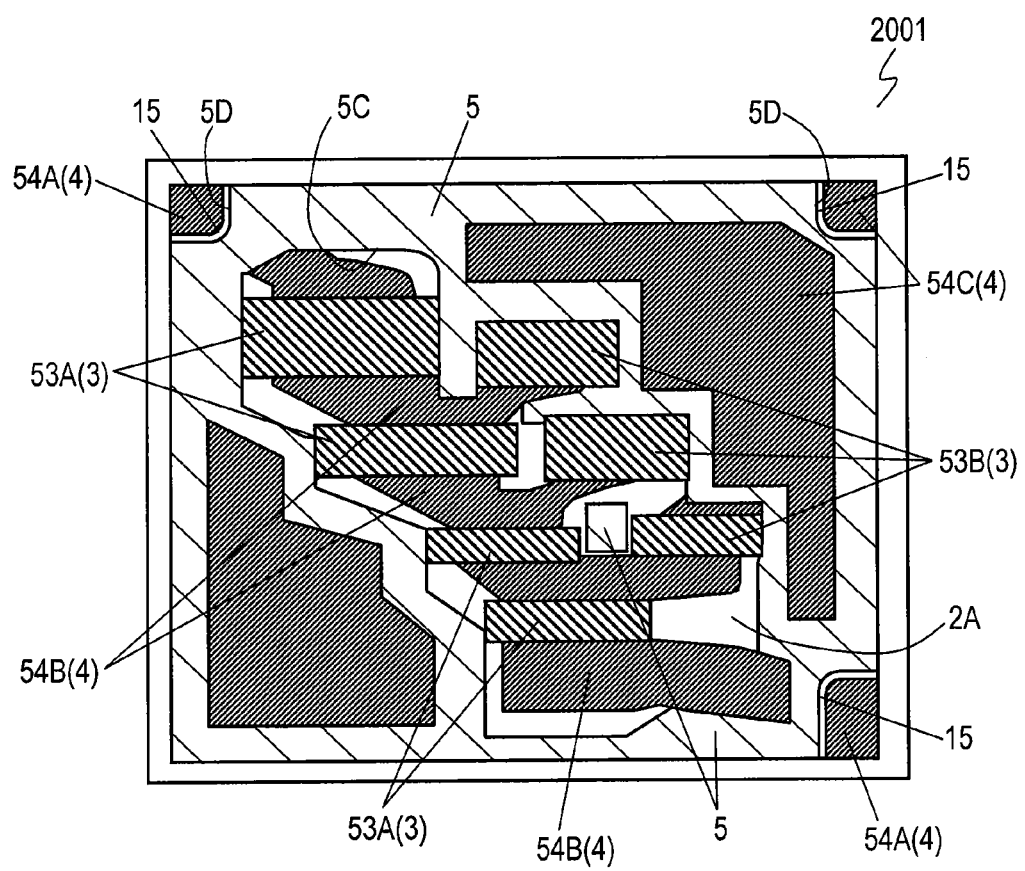
FIG. 3 is a top view of an acoustic wave filter including the acoustic wave device in accordance with Embodiment 1.

FIG. 3 is a top view of acoustic wave filter 2001 in accordance with Embodiment 1 for illustrating the arrangement of internal electrode 4 and side wall 5. As shown in FIG. 3, internal electrodes 4 are not shown partly since side wall 5 hides them. Lid 7, electrode base layer 9, insulator 10, connection electrode 12 and others are omitted in FIG. 3 in order to illustrate the pattern of internal electrode 4 and side wall 5 more conspicuously.

Acoustic wave filter 2001 includes two internal electrodes 54A to be used as pad (hereinafter referred to as internal electrodes 54A for pad), plural IDT electrodes 53A connected in series via internal electrodes 54B for wiring between the two internal electrodes 54A for pad, internal electrode 54C for grounding connected to a grounding terminal, and IDT electrodes 53B connected in parallel between internal electrode 54C for grounding and internal electrode 54B for wiring.

Internal electrodes 54A for pad, internal electrodes 54B for wiring, IDT electrodes 53A connected in series, internal electrodes 54C for grounding, and IDT electrodes 53B connected in parallel are provided on upper surface 2A of piezoelectric substrate 2. Two internal electrodes 54A for pad are connected to input-output terminals. Internal electrodes 54A for pad, internal electrodes 54B for wiring, and internal electrodes 54C for grounding are internal electrode 4 shown in FIG. 1B. IDT electrodes 53A connected in series and IDT electrodes 53B connected in parallel are IDT electrode 3 shown in FIG. 1B.

As shown in FIG. 3, anti-corrosion layers 15 provided between internal electrodes 54A for pad and side wall 5 are placed such that layers 15 protrudes to outer side walls 5D of wall 5 in view from top.

Figure 4:
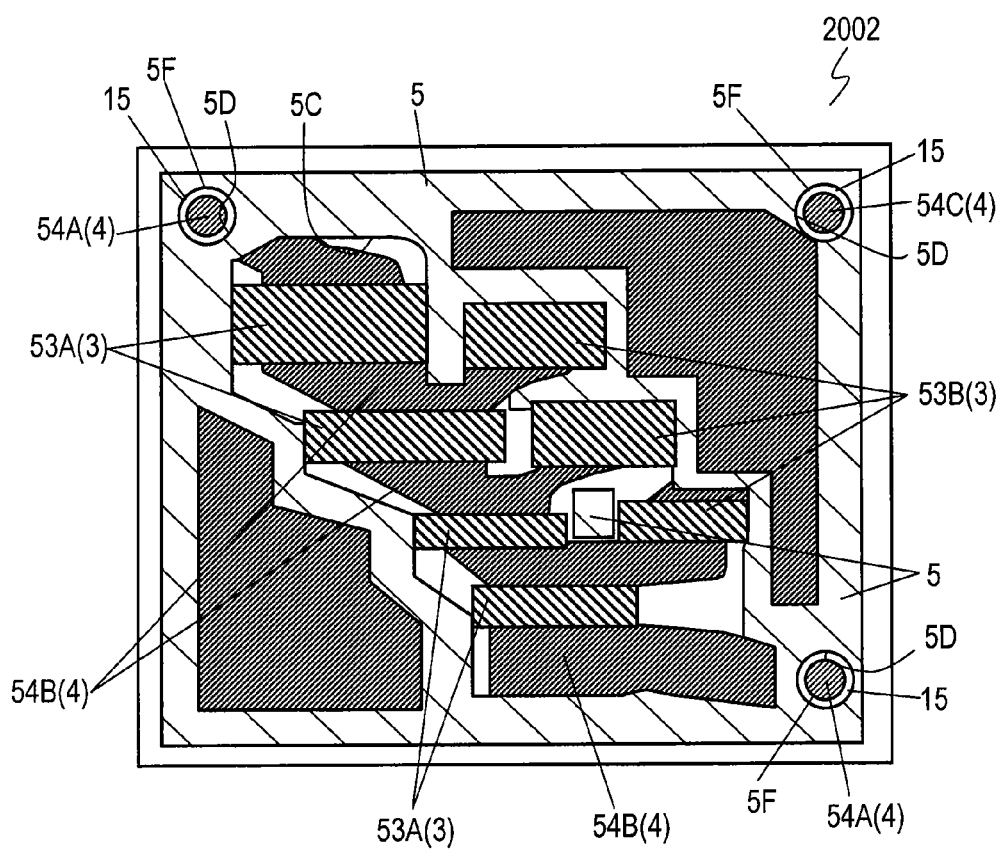
FIG. 4 is a top view of another acoustic wave filter including the acoustic wave device in accordance with Embodiment 1.

FIG. 4 is a top view of acoustic wave filter 2002 in accordance with Embodiment 1 for illustrating the arrangement of internal electrodes 4 and side wall 5. In FIG. 4, internal electrodes 4 are not shown partly since side wall 5 hides them. Lid 7, electrode base layer 9, insulator 10, connection electrode 12 and others are omitted in order to illustrate the arrangement of internal electrode 4 and side wall 5 more conspicuously.

Side wall 5 has holes 5F located above internal electrodes 54A for pad. The connection electrodes pass through holes 5F. Anti-corrosion layer 15 formed between electrode 54A and wall 5 protrudes to inside hole 5F in view from top.

Anti-corrosion layer 15 formed between electrode 54A and wall 5 is less soluble in the plating solution which is used in the electrolytic plating process for forming connection electrodes 12 than internal electrode 54A(4) is. A void is produced between side wall 5 and internal electrodes 54A for pad, so that the electrode base layer may not adhere securely to the boundary between wall 5 and electrodes 54A. Even in this case, anti-corrosion layer 15 between electrodes 54A and wall 5 prevents electrodes 54A from being corroded during the electrolytic plating process. This prevents electrodes 54A (4) from breaking, and increases the yield rates of acoustic wave filters 2001 and 2002.

Acoustic wave device 1 in accordance with Embodiment 1 can be used not only in a ladder-type filter but also in other types of filters, such as DMS filter.

According to Embodiment 1, the structure of acoustic wave device 1 and the method for manufacturing thereof are demonstrated. The method for forming connection electrode 12 described in the foregoing structure and the manufacturing method are applicable to the manufacturing of electronic components, such as semiconductor chips, other than the acoustic wave device.

Exemplary Embodiment 2

Figure 5A:
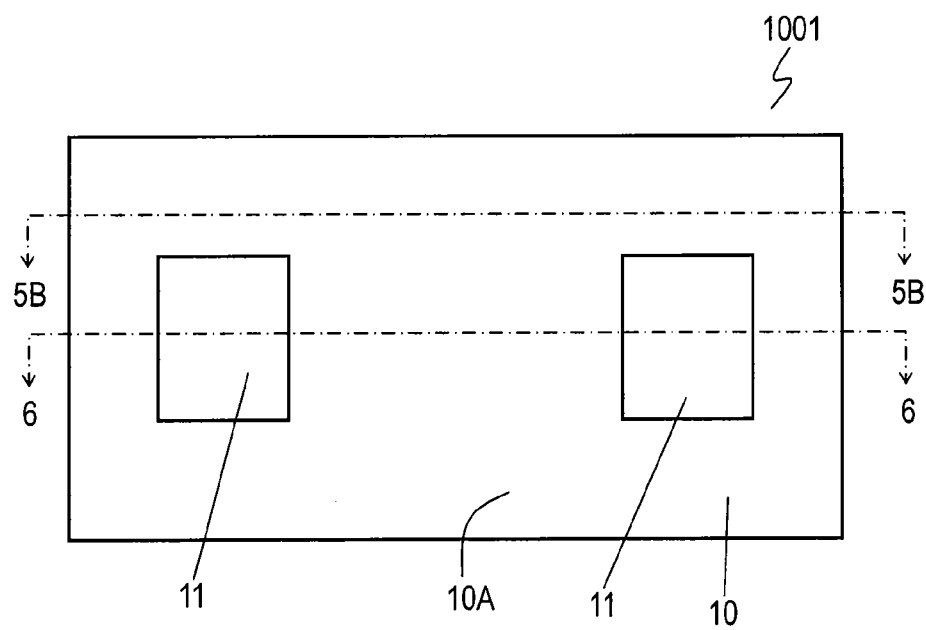
FIG. 5A is a top view of an acoustic wave device in accordance with exemplary Embodiment 2 of the invention.
Figure 5B:
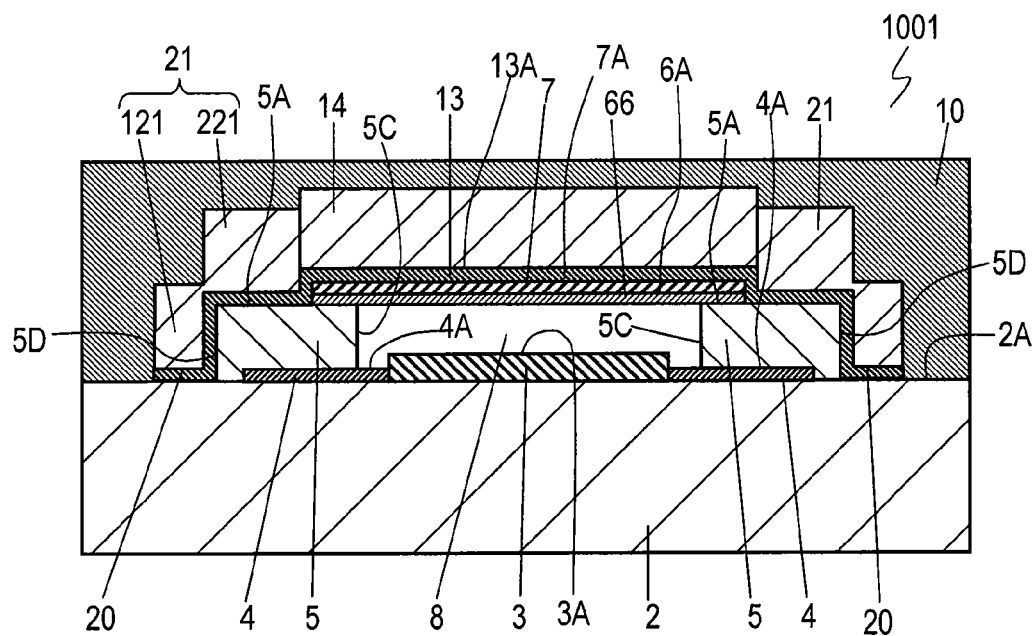
FIG. 5B is a sectional view of the acoustic wave device on line 5B-5B shown in FIG. 5A.

FIG. 5A is a plan view of acoustic wave device 1001 in accordance with Exemplary Embodiment 2 of the present invention. FIG. 5B is a sectional view of acoustic wave device 1001 on line 5B-5B shown in FIG. 5A.

Acoustic wave device 1001 is a chip-size packaged device and includes piezoelectric substrate 2, interdigital transducer (IDT) electrode 3 provided on upper surface 2A of substrate 2, and insulator 10 provided on upper surface 2A of piezoelectric substrate 2 for covering and protecting IDT electrode 3 from the outside.

Acoustic wave device 1001 further includes internal electrode 4 provided on upper surface 2A of piezoelectric substrate 2, side wall 5 provided on upper surface 2A of piezoelectric substrate 2 or on upper surface 4A of internal electrode 4, i.e., above upper surface 2A of piezoelectric substrate 2 or above upper surface 4A of internal electrode 4, and lid 7 provided on upper surface 5A of side wall 5 via adhesive layer 66. Internal electrode 4 is electrically connected with IDT electrode 3. Side wall 5 surrounds IDT electrode 3 to provide space 8 above IDT electrode 3. Lid 7 covers space 8.

Acoustic wave device 1001 further includes lid base layer 13 provided on upper surface 7A of lid 7, and lid reinforcing layer 14 provided on upper surface 13A of lid base layer 13 and made of plated metal. Lid reinforcing layer 14 increases the mechanical strength of lid 7.

Side wall 5 has inner side surface 5C facing space 8 and outer side surface 5D opposite to inner side surface 5C. Acoustic wave device 1001 further includes side-wall base layer 20 provided on upper surface 5A and outer side surface 5D of wall 5. Side-wall base layer 20 is electrically connected with lid base layer 13. Side-wall base layer 20 is provided also on a portion of upper surface 2A of substrate 2 opposite to space 8 with respect to side wall 5, or is provided on a portion of upper surface 4A of internal electrode 4. opposite to space 8 with respect to side wall 5

Acoustic wave device 1001 further includes side-wall reinforcing layer 21 made of plated metal for covering outer side surface 5D and upper surface 5A of wall 5 via side-wall base layer 20. Side-wall reinforcing layer 21 is electrically connected with lid reinforcing layer 14.

Figure 6:
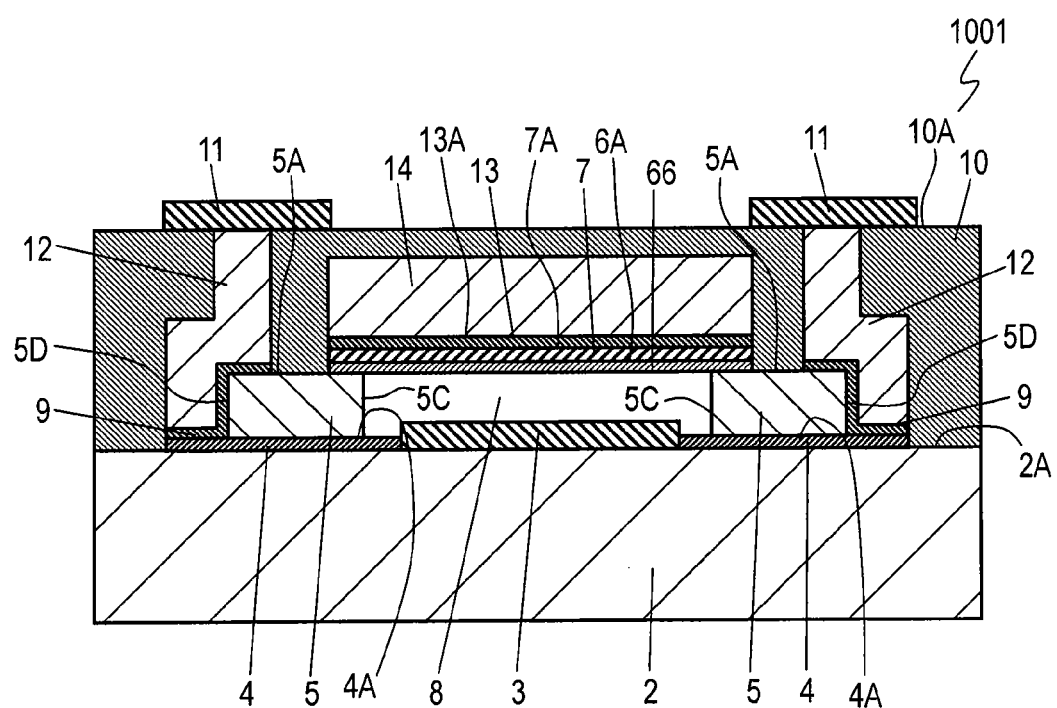
FIG. 6 is a sectional view of the acoustic wave device on line 6-6 shown in FIG. 5A.

FIG. 6 is a sectional view of acoustic wave device 1001 on line 6-6 shown in FIG. 5A, and illustrates connection electrodes 12.

As shown in FIG. 6, acoustic wave device 1001 further includes electrode base layer 9 provided on upper surface 4A of internal electrode 4 and on outer side surface 5D as well as upper surface 5A of wall 5, connection electrode 12 provided on upper surface 9A of electrode base layer 9, and external electrode 11 provided on upper surface 10A of insulator 10. Connection electrode 12 is made of plated metal and extends through insulator 10 for electrically connecting external electrode 11 to IDT electrode 3.

Piezoelectric substrate 2 is made of single-crystal piezoelectric material, such as crystal, lithium tantalite, lithium niobate, or potassium niobate. Substrate 2 has a thickness ranging from about 100 μm to 350 μm.

IDT electrode layer 3 includes comb-shaped electrodes having a thickness ranging from about 0.1 μm to 0.5 μm, and is made of single metal of aluminum, copper, silver, gold, titanium, tungsten, platinum, chrome, or molybdenum. Layer 3 can be made of alloy mainly containing at least one of the above metals, or laminated structure of at least one of the metals.

Internal electrode 4 is a conductor for electrically connecting external electrode 11 to IDT electrode 3, and is made of single metal of aluminum, copper, or silver. Electrode 4 can be made of alloy mainly containing at least one of the above metals, or laminated structure of at least one of the metals.

Side wall 5 surrounds IDT electrode 3 at least partly, and has a height ranging from about 5 μm to 15 μm. Side wall 5 is made of insulating material, and preferably made of resin since resin can be processed to have a predetermined shape easily. To be more specific, photosensitive resin, such as photosensitive polyimide resin, photosensitive epoxy resin, or photosensitive acrylate resin, provides side wall 5 with a predetermined shape accurately, which is necessary to form plural acoustic wave devices 1 on piezoelectric substrate 2. Photosensitive polyimide resin is preferable among others for side wall 5 since this resin has a high glass transitional point and high reliability in a high temperature environment.

Lid 7 is a plate having a thickness ranging from 1 μm to 10 μm and is bonded to upper surface 5A of side wall 5 with adhesive layer 66. Lid 7 together with piezoelectric substrate 2 and side wall 5 accommodates IDT electrode 3. Lid 7 is preferably made of metal because of its excellent mechanical strength and electrical conductivity that allows controlling electrical potential of lid 7. Copper is preferable as the material for lid 7 since copper has a liner expansion coefficient similar to that of single crystal piezoelectric substrate 2. Lid 7 can have a foil shape. In this case, adhesive layer 66 is formed in advance, and then lid 7 is stuck on the upper surface of side wall 5. This structure allows acoustic wave device 1 to be handled easily in the manufacturing processes.

Space 8 is an airtight area surrounded by piezoelectric substrate 2, side wall 5, and lid 7, and accommodates IDT electrode 3 therein. Space 8 can be filled with air at a normal atmospheric pressure; however, space 8 is preferably sealed and decompressed to a pressure lower than the atmospheric pressure since this condition prevents the IDT electrode from corrosion.

Electrode base layer 9 is made of metallic thin film and formed on upper surface 4A of internal electrode 4 and outside of side wall 5, i.e. opposite to space 8 with respect to wall 5. Electric base layer 9 is also formed on outer side surface 5D of side wall 5. Electric base layer 9 is made of single metal of titanium, copper, nickel, chrome, or magnesium. Electric base layer 9 can be made of alloy mainly containing at least one of the above metals. These materials are less soluble in plating solution than the material of internal electrode 4. Titanium among others is preferable for Electric base layer 9 because of its excellent adhesive properties. Electric base layer 9 can have a double-layer structure including a titanium layer and a copper layer provided on the titanium layer. The titanium layer is provided on upper surface 4A of internal electrode 4, upper surface 15A of anti-corrosion layer 15, and outer side surface 5D of side wall 5. This structure allows connection electrode 12 to be formed easily.

Insulator 10 is placed on upper surface 2A of piezoelectric substrate 2 and outer side surface 5D of side wall 5, and on upper surface 5A of wall 5 and upper surface 7A of lid 7. Insulator 10 covers lid reinforcing layer 14 and side-wall reinforcing layer 21. Insulator 10 covers upper surface 2A, a main surface of piezoelectric substrate 2, thereby protecting IDT electrode 3 and others from mechanical shocks and moisture. Insulator 10 covers lid 7 and lid-reinforcing layer 14. Insulator 10 is preferably made of thermosetting resin because of its excellence in handling. Epoxy resin is preferable because of its heat resistance and air-tightness. Epoxy resin containing inorganic filler is more preferable since it has a low linear expansion coefficient. The inorganic filler may contain aluminum oxide powder, $SiO_2$ powder, or MgO powder.

External electrode 11 is formed on upper surface 10A of insulator 10 and is electrically connected with connection electrode 12. According to Embodiment 2, insulator 10 is formed between external electrode 11 and side wall 5 so as to prevent electrode 11 from directly contacting side wall 5.

Connection electrode 12 is formed by an electrolytic plating process on internal electrode 4 via electrode base layer 9. Connection electrode 12 is preferably made of copper since copper has a large mechanical strength and has a linear expansion coefficient matching that of piezoelectric substrate 2. Connection electrode 12 is electrically connected with internal electrode 4. In the case that connection electrode 12 is connected to an input/output terminal, connection electrode 12 is isolated electrically from lid 7, lid base layer 13, lid reinforcing layer 14, and side-wall base layer 20. In the case that connection electrode 12 is connected to a grounding terminal, connection electrode 12 connected to lid 7, lid base layer 13, lid reinforcing layer 14, and side-wall base layer 20 stabilizes a grounding potential.

Lid base layer 13 is formed on lid 7 and made of metal thin film. This metal is at least single metal of titanium, copper, nickel, chrome, or magnesium. The metal can be made of alloy mainly containing at least one of the above metals. Titanium among others is preferable for lid base layer 13 because of its excellent adhesiveness. Lid base layer 13 can have a double-layer structure including a titanium layer and a copper layer similar to the structure of electrode base layer 9 shown in FIG. 1C. This structure preferably allows lid reinforcing layer 14 to be formed easily. Lid base layer 13 functions as a base coat for the electrolytic plating.

Lid reinforcing layer 14 is formed by the electrolytic plating process on upper surface 13A of lid base layer 13, and has a thickness ranging from about 20 μm to 40 μm. Lid reinforcing layer 14 can be preferably made of single metal of copper, gold, silver, platinum, or nickel. Layer 14 can be made of alloy mainly containing at least one of the above metals. Copper is preferable because copper has a large mechanical strength and has a linear expansion coefficient matching that of piezoelectric substrate 2.

Side-wall base layer 20 is made of metal thin film formed on upper surface 2A of piezoelectric substrate 2, on outer side surface 5D and upper surface 5A of side wall 5. Side-wall base layer 20 can be made of single metal of titanium, copper, nickel, chrome, or magnesium. Side-wall base layer 20 can be made of alloy mainly containing at least one of the above metals. The foregoing materials are less soluble in the plating solution than the material of internal electrode 4. Titanium among others is preferable for layer 20 because of its excellent adhesiveness. Side-wall base layer 20 can have a double-layer structure including a titanium layer and a copper layer similar to the structure of electrode base layer 9 shown in FIG. 1C. This structure preferably allows side-wall reinforcing layer 21 to be formed easily.

Side-wall reinforcing layer 21 is electrically connected with lid reinforcing layer 14 and covers side-wall base layer 20. Side-wall reinforcing layer 21 is formed by the electrolytic plating process and has a thickness ranging from about 20 μm to 40 μm. Side-wall reinforcing layer 21 can be preferably made of single metal of copper, gold, silver, platinum, or nickel. Side-wall reinforcing layer 21 can be made of alloy mainly containing at least one of the above metals. Copper is preferable because copper has a large mechanical strength and has a linear expansion coefficient matching that of piezoelectric substrate 2. In FIG. 5B, side-wall reinforcing layer 21 is formed on outer side surface 5D and upper surface 5A of wall 5. In the case that lid 7 is formed entirely on upper surface 5A, side-wall reinforcing layer 21 can be formed only on outer side surface 5D.

Side-wall reinforcing layer 21 is made of plated metal, and prevents moisture from entering space 8 via side wall 5 from the outside of acoustic wave device 1001 so as to prevent aged deterioration in characteristics of acoustic wave device 1001.

Side-wall reinforcing layer 21 can increase the mechanical strength of side wall 5, and improves the anti-shock property of acoustic wave device 1001 accordingly.

A method for manufacturing acoustic wave device 1001 in accordance with Embodiment 2 will be described below. FIGS. 7A to 7I are sectional views of acoustic wave device 1001 for schematically illustrating processes for manufacturing acoustic wave device 1001.

Figure 7A:
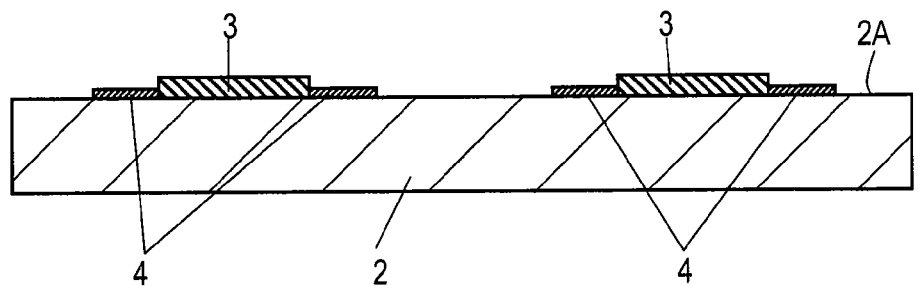
FIGS. 7A to 7I are sectional views of the acoustic wave device in accordance with Embodiment 2 for illustrating processes for manufacturing the acoustic wave device.

First, as shown in FIG. 7A, plural IDT electrodes 3 are formed on upper surface 2A of piezoelectric substrate 2 by sputtering with photolithographic technique using a resist. Internal electrodes 4 are formed on upper surface 2A by a vapor deposition method.

Figure 7B:
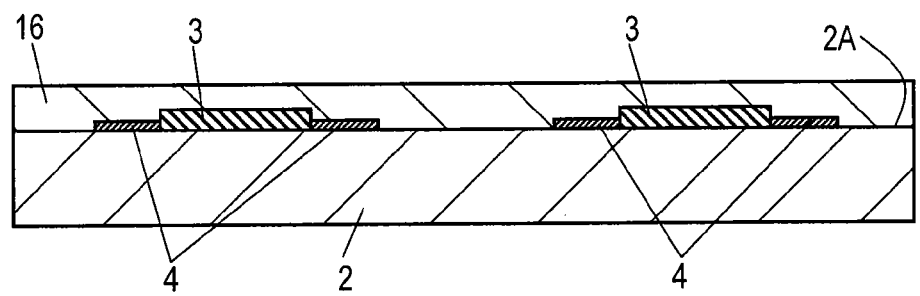

Next, as shown in FIG. 7B, photosensitive polyimide-based resin 16 is applied entirely onto upper surface 2A of piezoelectric substrate 2 for covering IDT electrodes 3 and internal electrodes 4 by a spin-coating method, dispensing method, or screen printing method. The spin-coating method among others is preferable because this method provides the resin with a uniform thickness.

Figure 7C:
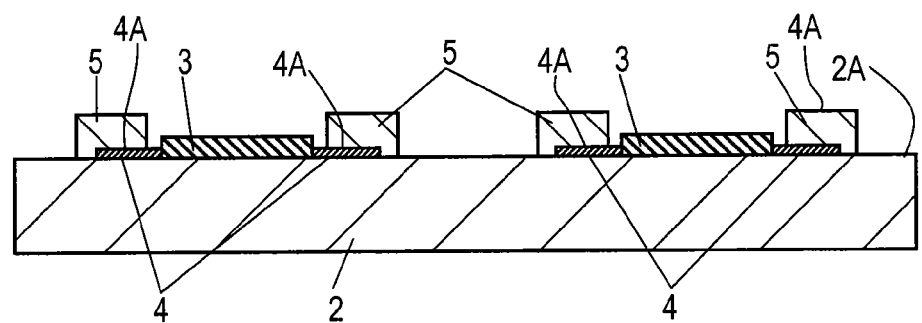
Figure 7D:
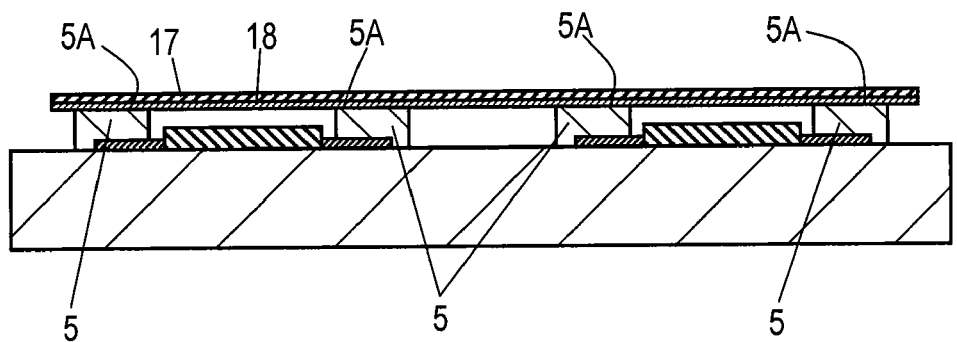
Figure 7E:
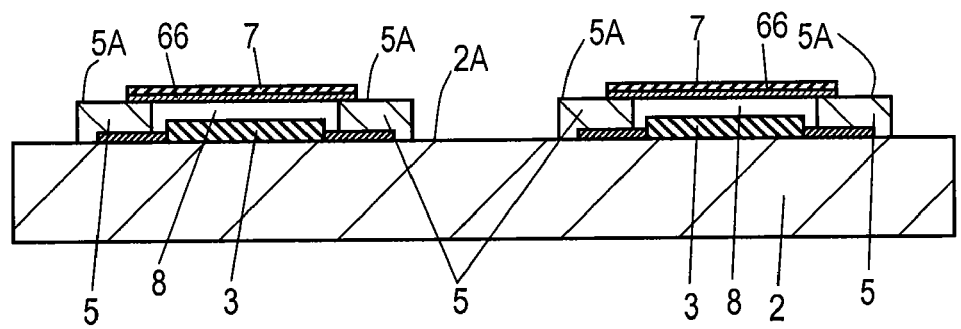

Next, the applied resin is exposed and developed through a predetermined mask from upper surface 2A, and then is thermally hardened to form side walls 5 which surround IDT electrodes 3 as shown in FIG. 7C. After forming walls 5 to have a predetermined shape, walls 5 are heated if necessary for accelerating the hardening of the walls.

As shown in FIG. 7, metal foil supposed to be lid 7 is stuck to the upper surface of side wall 5 via adhesive agent 18, and then, metal foil 17 is etched through a resist by the photolithographic method, thereby patterning metal foil 17 having a predetermined shape. Then, the resist is removed. An unnecessary portion of adhesive agent 18 is removed by a dry etching method. These processes provides space 8 above IDT electrode 3 to be covered with lid 7 and adhesive layer 66, as shown in FIG. 7E. No portion of lid 7 or adhesive layer 66 preferably remains entirely on upper surface 5A of side wall 5. In other words, lid 7 and adhesive layer 66 are preferably formed inside an outer edge where upper surface 5A is connected with outer side surface 5D of side wall 5 in view from top. If lid 7 and adhesive layer 66 protrude outward from upper surface 5A in view from top, base layer 19, to be formed by sputtering after this process is prevented from adhering to outer side surfaces 5D or upper surface 5A of side wall 5.

Figure 7F:
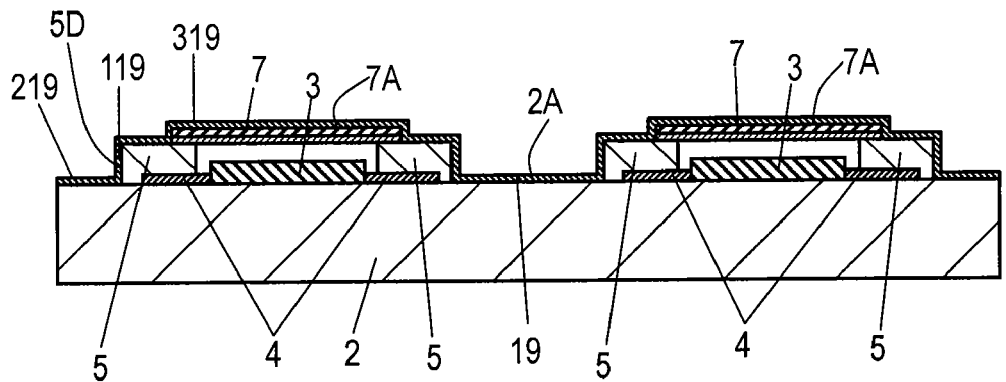

Next, as shown in FIG. 7F, base layer 19 is formed entirely on upper surface 2A of piezoelectric substrate 2 by sputtering. Portions 119 and 219 of base layer 19 formed on outer side surface 5D of wall 5 and on upper surface 2A of substrate 2 constitute side-wall base layer 20. Portion 319 of base layer 19 formed on upper surface 7A of lid 7 constitutes lid base layer 13.

Figure 7G:
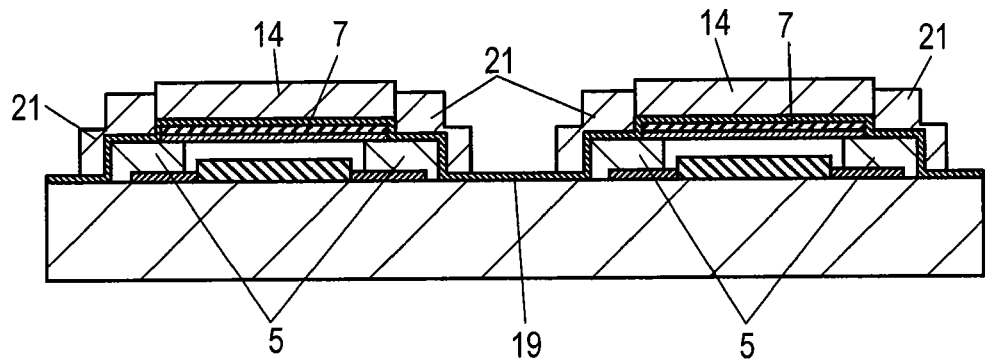

Then, a resist is formed by photolithographic technique on portions of base layer 19 other than a portion where the electrolytic plating grows. To be more specific, the resist exposes a portion of the upper surface of base layer 19 to be side-wall base layer 20 as well as a portion of the upper surface of base layer 19 to be lid base layer 13, and the resist covers the other portions. Then, the first electrolytic plating is performed so that side-wall reinforcing layer 21 can be formed on side-wall base layer 20. At this moment, lid reinforcing layer 14 is formed on lid base layer 13. Then, the resist is removed, as shown in FIG. 7G. Lid reinforcing layer 14 and side-wall reinforcing layer 21 reinforce lid 7 and side wall 5, respectively. Lid reinforcing layer 14 and side-wall reinforcing layer 21 reinforce lid 7 are formed simultaneously, thus forming side-wall reinforcing layer 21 efficiently.

Then, a resist is formed entirely on upper surface 2A of piezoelectric substrate 2 except a portion where connection electrode 12 is formed. This resist is also on the upper surface of lid reinforcing layer 14 and the upper surface of side-wall reinforcing layer 21. Then, the second electrolytic plating is performed, so that connection electrode 12 can extend to have a height greater than that of the resist, and then, the resist is removed.

The resist between at least one of connection electrodes 12 and lid reinforcing layer 14 or side-wall reinforcing layer 21 can be removed so that connection electrodes 12 can be connected with lid reinforcing layer 14 or side-wall reinforcing layer 21 during the first electrolytic plating step. This structure prevents lid 7 and lid reinforcing layer 14 or side-wall reinforcing layer 21 from floating electrically, and stabilizes electric potentials of them. In particular, lid 7, lid reinforcing layer 14 or side-wall reinforcing layer 21 can be connected with connection electrode 12 functioning as a grounding terminal to provide lid 7 and lid reinforcing layer 14 or side-wall reinforcing layer 21 with a ground potential, so that lid 7 and lid reinforcing layer 14 and side-wall reinforcing layer 21 can function as shielding layers that protect IDT electrode 3 from noises.

Figure 7H:
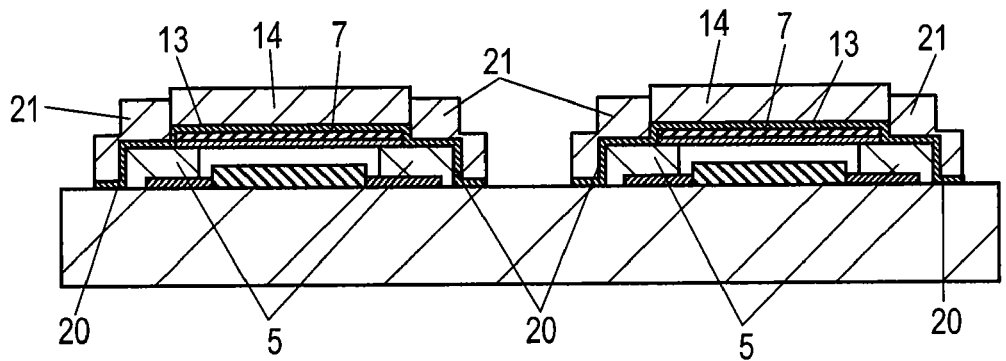

As shown in FIG. 7H, base layer 19 is removed partly by etching so that side-wall base layers 20 are isolated electrically from each other. In the case that lid reinforcing layer 14 or side-wall reinforcing layer 21 is connected to connection electrode 12 by plating, a portion of base layer 19 existing between connection electrode 12 and lid reinforcing layer 14 or side-wall reinforcing layer 21 is not removed.

Figure 7I:
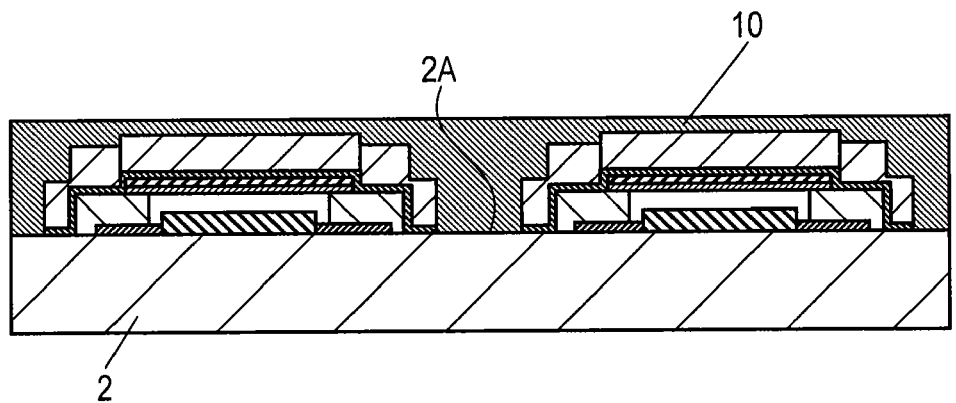

As shown in FIG. 7I, insulator 10 is formed by a printing method to cover the main surface, upper surface 2A of piezoelectric substrate 2 and elements placed on upper surface 2A. In order to provide insulator 10 with a height identical to that of connection electrodes 12, insulator 10 is formed temporarily to have a height greater than that of upper surfaces 12A of electrodes 12, and then, is ground off mechanically. In this case, insulator 10 is formed to cover all components, such as electrodes 12, located on upper surfaces 2A, and then ground off mechanically. The height of insulator 10 can hardly be identical to that of electrodes 12 without the grinding off electrodes 12 at all while insulator 10 is ground off. Therefore, electrodes 12 are ground off partly with the grinding off of insulator 10. Considering this fact, connection electrodes 12 are preferably formed by the electrolytic plating process to have a height slightly greater than the actually required height. Then, insulator 10 and electrodes 12 are ground to allows the heights of them to be identical to each other, thus providing a flatness, so that acoustic wave device 1001 can have a shape suitable to be mounted on a board.

The resist formed after the first electrolytic plating process can be used as insulator 10 on lid reinforcing layer 14 and side-wall reinforcing layer 21.

Finally, external electrodes 11 connected electrically to the upper surfaces of connection electrodes 12 are formed. Then, piezoelectric substrate 2 and insulator 10 are divided simultaneously by dicing, thereby providing individual chips of acoustic wave device 1001 from an assembled board.

Next, the arrangement internal electrode 4 and side wall 5 of acoustic wave device 1001 in accordance with Embodiment 2 used in an acoustic wave filter will be described below with reference to a figure.

Figure 8A:
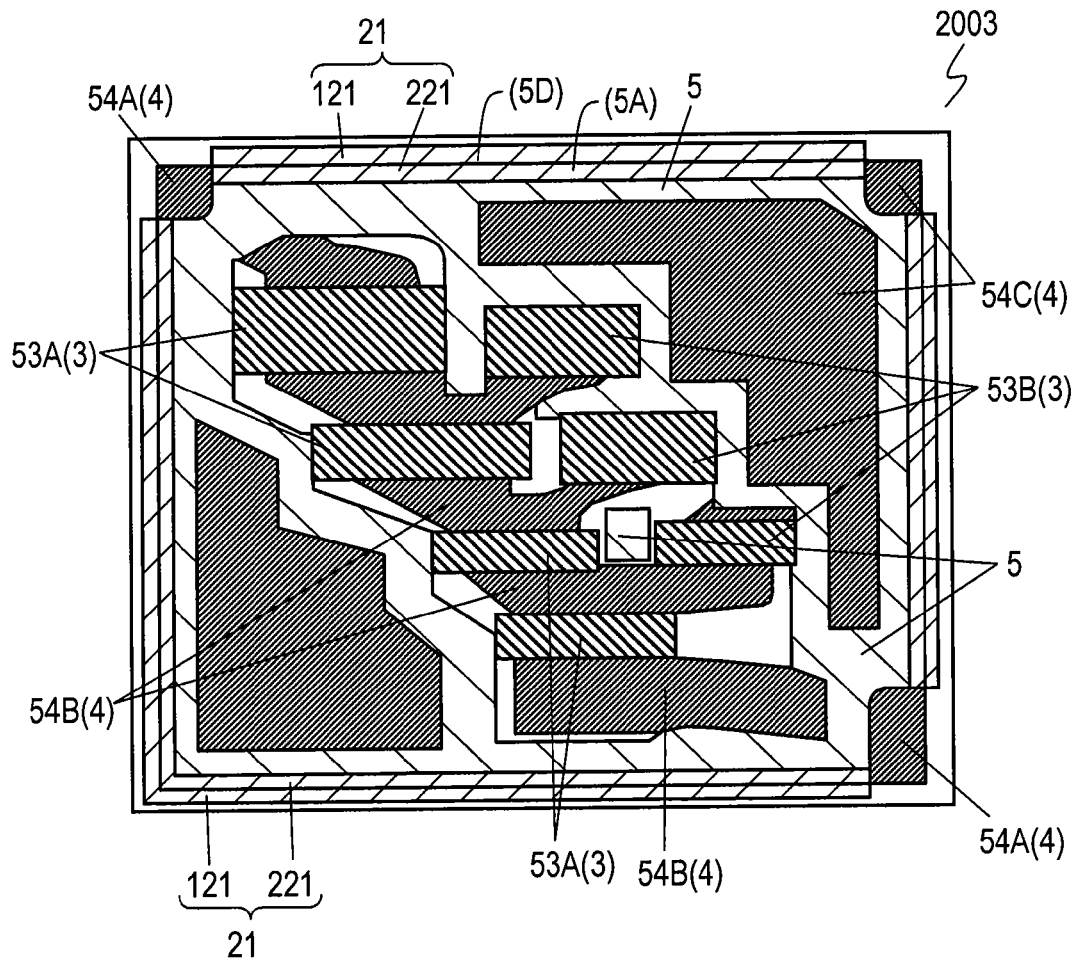
FIG. 8A is a top view of an acoustic wave filter including the acoustic wave device in accordance with Embodiment 2.

FIG. 8A is a top view of acoustic wave filter 2003 in accordance with Embodiment 2 for illustrating the arrangement of internal electrode 4, side wall 5, and side-wall reinforcing layer 21. In FIG. 8A, internal electrodes 4 are not shown partly since side wall 5 hides them. Lid 7, electrode base layer 9, insulator 10, connection electrode 12 and others are omitted in order to illustrate the arrangement of internal electrode 4, side wall 5 and side-wall reinforcing layer 21 conspicuously.

Acoustic wave filter 2003 includes two internal electrodes 54A for pad connected to input/output terminals, plural IDT electrodes 53A connected in series via internal electrodes 54B for wiring between the two internal electrodes 54A for pad, internal electrode 54C for grounding connected to a grounding terminal, and IDT electrodes 53B connected in parallel between internal electrode 54C for grounding and internal electrode 54B for wiring.

Two internal electrodes 54A for pad, internal electrodes 54B for wiring, plural IDT electrodes 53A connected in series, internal electrodes 54C for grounding, and IDT electrodes 53B connected in parallel are provided on upper surface 2A of piezoelectric substrate 2. Internal electrodes 54A for pad, internal electrodes 54B for siring, and internal electrodes 54C for grounding are internal electrode 4 shown in FIGS. 5B and 6. Plural IDT electrodes 53A connected in series and IDT electrodes 53B connected in parallel are IDT electrode 3 shown in FIGS. 5B and 6.

As shown in FIGS. 5B and 8A, side-wall reinforcing layer 21 placed at the periphery of side wall 5 includes portion 121 covering outer side surface 5D and portion 221 covering upper surface 5A of wall 5.

Side-wall reinforcing layer 21 is made of plated metal, and prevent moisture from entering space 8 via side wall 5 from the outside of acoustic wave device 1001, preventing aged deterioration in characteristics of device 1001.

Side-wall reinforcing layer 21 can increase the mechanical strength of side wall 5, thereby improving the anti-shock property of device 1001.

Acoustic wave device 1001 in accordance with Embodiment 2 can be used not only in ladder-type filters but also in other types of filter, such as DMS filters.

Figure 8B:
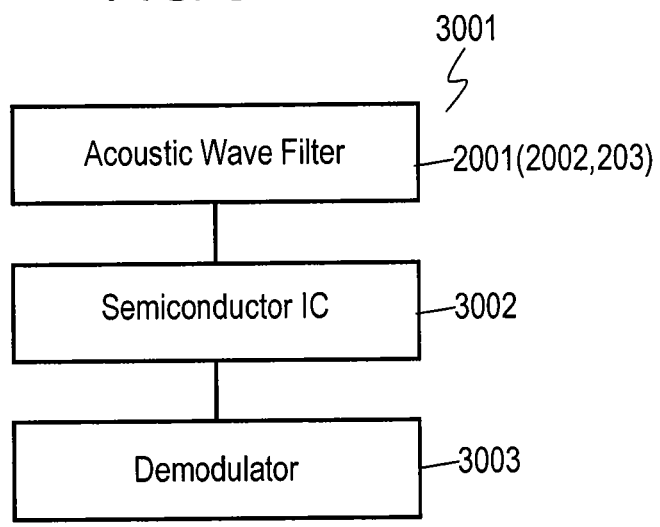
FIG. 8B is a block diagram of an electronic apparatus in accordance with Embodiments 1 and 2.
Figure 9:
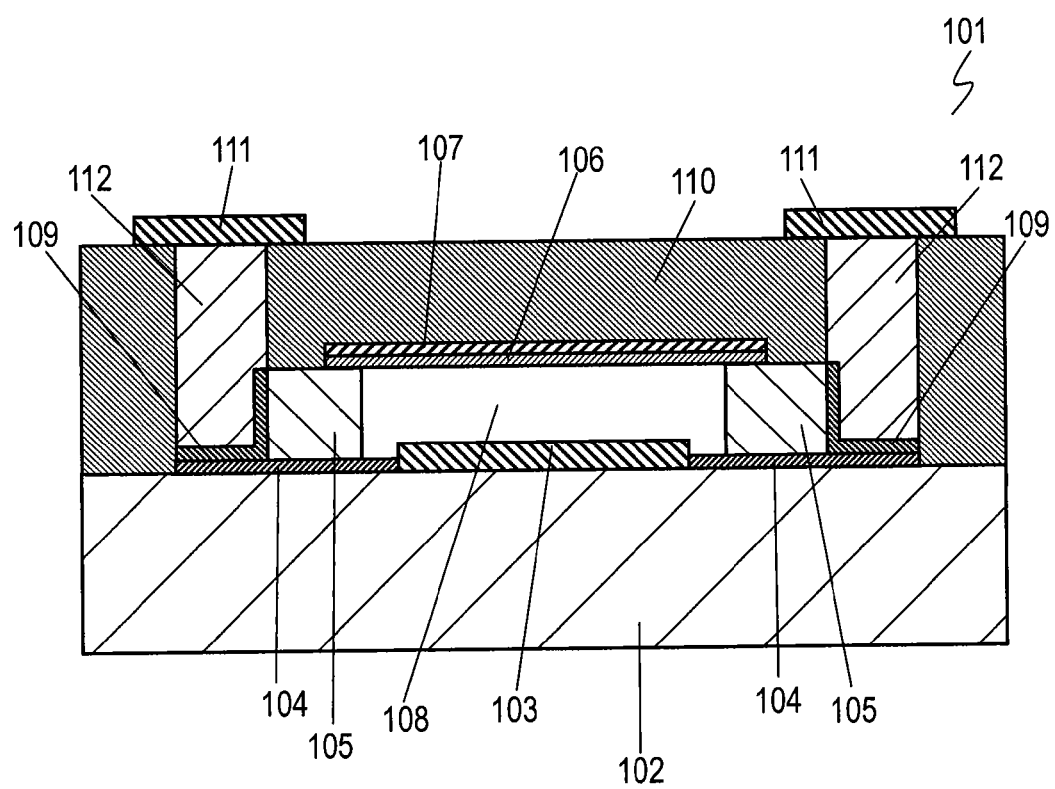
FIG. 9 is a sectional view of a conventional acoustic wave device.

FIG. 8B is a block diagram of electronic apparatus 3001 in accordance with Embodiments 1 and 2. Electronic apparatus 3001 is a communication apparatus and includes acoustic wave filter 2001 (2002, 2003), semiconductor integrated circuit (IC) 3002 connected to acoustic wave filter 2001 (2002, 2003), and demodulator 3003 connected to semiconductor IC 3002. Acoustic filter 2001 (2002, 2003) provides electronic apparatus 3001 with high communication quality.

Acoustic wave devices 1 and 1001 prevent internal electrode 4 from breaking with the plating solution, and can be used in electronic apparatuses such as a mobile communication apparatus.

According to Embodiments 1 and 2, terms, such as "upper surface" and "lower surface", indicating directions indicate relative directions depending only on the relative positional relation between structural elements, such as the piezoelectric substrate, the IDT electrode, of the acoustic wave device, and do not indicate absolute directions, such as a vertical direction.

What is claimed is:

1. An acoustic wave device comprising:
a piezoelectric substrate;
an interdigital transducer (IDT) electrode provided on the piezoelectric substrate;
an internal electrode provided above the piezoelectric substrate and electrically connected to the IDT electrode;
a side wall provided above the internal electrode and surrounding the IDT electrode;
a lid provided on the side wall for covering the IDT electrode to provide a space above the IDT electrode;
an electrode base layer provided on the internal electrode and outside the space and the side wall;
a connection electrode provided on the electrode base layer; and
an anti-corrosion layer provided between the internal electrode and the side wall, the anti-corrosion layer protruding outside the side wall, the anti-corrosion layer being made of material less soluble in plating solution than the internal electrode.

2. The acoustic wave device according to claim 1, wherein the anti-corrosion layer is made of metal.

3. The acoustic wave device according to claim 1, wherein the anti-corrosion layer is made of single metal of titanium, chrome, molybdenum, tungsten, gold, or platinum, or made of alloy mainly containing at least one of titanium, chrome, molybdenum, tungsten, gold, and platinum.

4. The acoustic wave device according to claim 1, wherein the anti-corrosion layer is made of insulating material mainly containing silicon nitride, silicon oxynitride, or silicon oxide.

5. The acoustic wave device according to claim 1, wherein the anti-corrosion layer is made of metal oxide.

6. The acoustic wave device according to claim 1, wherein
the side wall has a lower surface facing the internal electrode, and
the anti-corrosion layer is provided between the entire lower surface of the side wall and the internal electrode.

7. The acoustic wave device according to claim 1, wherein
the side wall further has an inner side surface facing the space and an outer side surface opposite to the inner side surface, and
the lid is placed inside the outer side surface of the side wall.

8. An electronic apparatus comprising:
the acoustic wave device according to claim 1;
a semiconductor integrated circuit connected to the acoustic wave device; and
a demodulator connected to the semiconductor integrated circuit.

9. An acoustic wave device comprising:
a piezoelectric substrate;
an interdigital transducer (IDT) electrode provided on the piezoelectric substrate;
a side wall provided above the piezoelectric substrate and surrounding the IDT electrode and made of resin;
a lid provided on the side wall for covering the IDT electrode to provide a space above the IDT electrode;
a lid reinforcing layer provided on the lid and made of plated metal; and
a side-wall reinforcing layer provided on the side wall, wherein
the side wall further has an inner side surface facing confronting the space and an outer side surface opposite to the inner side surface, and
the side-wall reinforcing layer is made of plated metal covering the outer side surface and is connected electrically to the lid reinforcing layer.

10. The acoustic wave device according to claim 9, wherein the side-wall reinforcing layer is made of single metal of copper, gold, silver, platinum or nickel, or made of alloy mainly containing at least one of copper, gold, silver, platinum, and nickel.

11. The acoustic wave device according to claim 9, wherein the lid is placed inside an outer edge where a upper surface of the side wall connects with the outer side surface.

12. An electronic apparatus comprising:
the acoustic wave device according to claim 9;
a semiconductor integrated circuit connected to the acoustic wave device; and
a demodulator connected to the semiconductor integrated circuit.

* * * * *